United States Patent [19]

Leveque et al.

[11] Patent Number: 4,839,906
[45] Date of Patent: Jun. 13, 1989

[54] PROCESSOR BASED LINKED COMPRESSOR-EXPANDER TELECOMMUNICATIONS SYSTEM

[75] Inventors: James H. Leveque, Ellicott City, Md.; Frederick A. Williams; John Eldon, both of Encinitas, Calif.

[73] Assignees: AMAF Industries, Inc., Columbia, Md.; TRW, Inc., Cleveland, Ohio

[21] Appl. No.: 196,235

[22] Filed: May 20, 1988

[51] Int. Cl.$^4$ .............................................. H04L 27/00
[52] U.S. Cl. ........................................ 375/37; 333/14; 455/72
[58] Field of Search ....................... 375/25, 30, 32, 37; 370/7; 455/72; 333/14; 381/106

[56] References Cited

U.S. PATENT DOCUMENTS

| | | | |
|---|---|---|---|
| 3,602,818 | 8/1971 | Anderlecht | 455/72 |
| 4,250,470 | 2/1981 | Szarvas | 333/14 |
| 4,253,072 | 2/1981 | Fisher et al. | 333/14 |
| 4,295,223 | 10/1981 | Shutterly | 370/7 |
| 4,539,707 | 9/1985 | Jacobs et al. | 455/72 |
| 4,677,645 | 6/1987 | Kaniwa et al. | 455/72 |
| 4,700,361 | 10/1987 | Todd et al. | 381/31 |

Primary Examiner—Robert L. Griffin
Assistant Examiner—Stephen Chin
Attorney, Agent, or Firm—Birch, Stewart, Kolasch & Birch

[57] ABSTRACT

A digital linked compressor-expander telecommunications system (Lincompex), is implemented using a general purpose digital signal processor wherein the compression and expansion functions are performed by blocks of programmed code. Input audio analog signals are converted to parallel data digital signals thereupon the digitial signals are input for processing. After processing, the resultant signals are passed to a 16-bit digital-to-analog converter where either the compressed or expanded digital voice data signal is converted back into an audio frequency analog signal for either transmission or communication on an output device.

10 Claims, 8 Drawing Sheets

FIG. 6 - SIGNAL COMPRESSION

FIG. 7   SIGNAL EXPANSION

PROCESSOR BASED LINKED COMPRESSOR-EXPANDER TELECOMMUNICATIONS SYSTEM

BACKGROUND OF THE INVENTION

The present invention is generally related to telecommunications systems, and more specifically is related to linked compressor-expander systems (Lincompex) implemented through the use of a digital signal processor. The present invention is an improvement over U.S. Pat. 4,271,499 to J. Howard Leveque.

Lincompex systems have generally been known since the early 1960's. Basically, Lincompex has been used in HF radio communication networks to significantly improve standards of quality and stability approaching those of cable and satellite systems. The basic principles of Lincompex are as follows. Incoming speech signals are split into speech and control paths. In the control path, the envelope of the input speech level is detected and a signal is generated proportional to this detected level. A compressor circuit in the speech path uses the signal from the control path to adjust its gain according to the detected speech level at a syllabic rate so as to output speech signals of substantially constant and compressed amplitude. The control path signal is converted to a logarithmic signal to compensate for the volts to decibels conversion and the logarithmic signal is applied to a voltage controlled oscillator which produces an output frequency related to the amount of speech signal compression conducted upon the corresponding syllable. The compressed speech signal and the control frequency signal are then combined, amplified and input to a transmitter.

At the receiver, the demodulated signal containing both the speech and control frequency components is filtered and separated into speech and control signal paths. The control signal frequency is detected and passed through a logarithmic to linear network to reattain the speech envelope level signal. This signal is then applied to an expander circuit in the speech path which amplifies the compressed speech signal to the original speech input signal.

Historically, Lincompex systems have been analog in nature. The analog systems are relatively large in size and expensive and require a substantial amount of periodic adjustment which would require radio operator support. The analog circuitry is complex in nature and must be designed to operate precisely over large temperature variations, vibration, and must remain within strict parameter limits so as to be compatible with other units.

Also known in the art is a digital Lincompex system as described by the above referenced Leveque patent wherein the attenuation function of the comressor is provided by a digital circuit driven by a digital control signal. The voltage controlled oscillator is incrementally varied by a digital control signal to produce a sinusoidal output control signal. The digital control signals which control the compressor and control frequency oscillator circuits are derived from a digital signal which is representative of the detected amplitude of an input speech signal.

While the known digital Lincompex system as embodied by U.S. Pat. No. 4,271,499 represents a significant improvement over the analog design in terms of improved S/N ratio, fewer calibration adjustments, and wide temperature range of operation, the hardwired digital system still requires the use of various analog circuitry for filtering, envelope detection, control tone generation, and signal mixing, which analog circuitry still suffers from noise interference, significant power dissipation, relatively large size, and limited stability and reliability.

SUMMARY OF THE INVENTION

It is thus an object of the present invention to increase the stability, versatility and reliability of a Lincompex communication system.

It is also an object of the present invention to reduce the noise production and power dissipation in a digital Lincompex communication system.

These and other objects of the present invention are fulfilled by providing a processor based Lincompex telecommunication system wherein the compressor and expander functions are performed on a programmable digital signal processor, including analog to digital converter means for converting an analog audio signal into a parallel data digital signal to be compressed by a digital signal processor means which performs the steps of filtering the digital signal to remove components above a predetermined frequency, shifting the phase of the filtered digital signal by 90°, supplementing the filtered digital signal with the phase shifted digital signal to produce a complex signal, computing the magnitude of the audio signal from the complex signal, time averaging the computed magnitude to approximate a syllabic rate of the audio signal, generating a digital control tone signal having a frequency representative of the time averaged magnitude, multiplying the digital signal by an amount inversely related to the time averaged magnitude to produce a compressed digital signal, and outputting the compressed digital signal and the digital control tone signal. The outputted signals are applied to a digital-to-analog conversion means for converting the compressed digital signal and the digital control tone signal to a combined analog signal for transmission on a transmission medium. The expander function is also performed by a digital signal processor means which performs the steps of separating compressed data components and expander control components of a parallel data digital signal produced by a analog-to-digital converter means in response to the input of a compressed analog signal containing data and modulated expander control components, multiplying the modulated expander control component by components of a predetermined frequency to obtain a demodulated control component, computing a value representing the compression factor of a data component based upon the demodulated control component, computing an expansion factor based upon the computed compression factor, multiplying the data component by the expansion factor to produce an expanded data signal and outputting the expanded data signal. A digital-to-analog converter means is provided for converting the expanded data signal to an audio frequency analog signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow with reference to the accompanying drawings which are given by way of illustration only, and thus are not limitative of the present invention, and wherein.

DETAILED DESCRIPTION OF THE PREFERRED EMBODIMENTS

Figure 1:
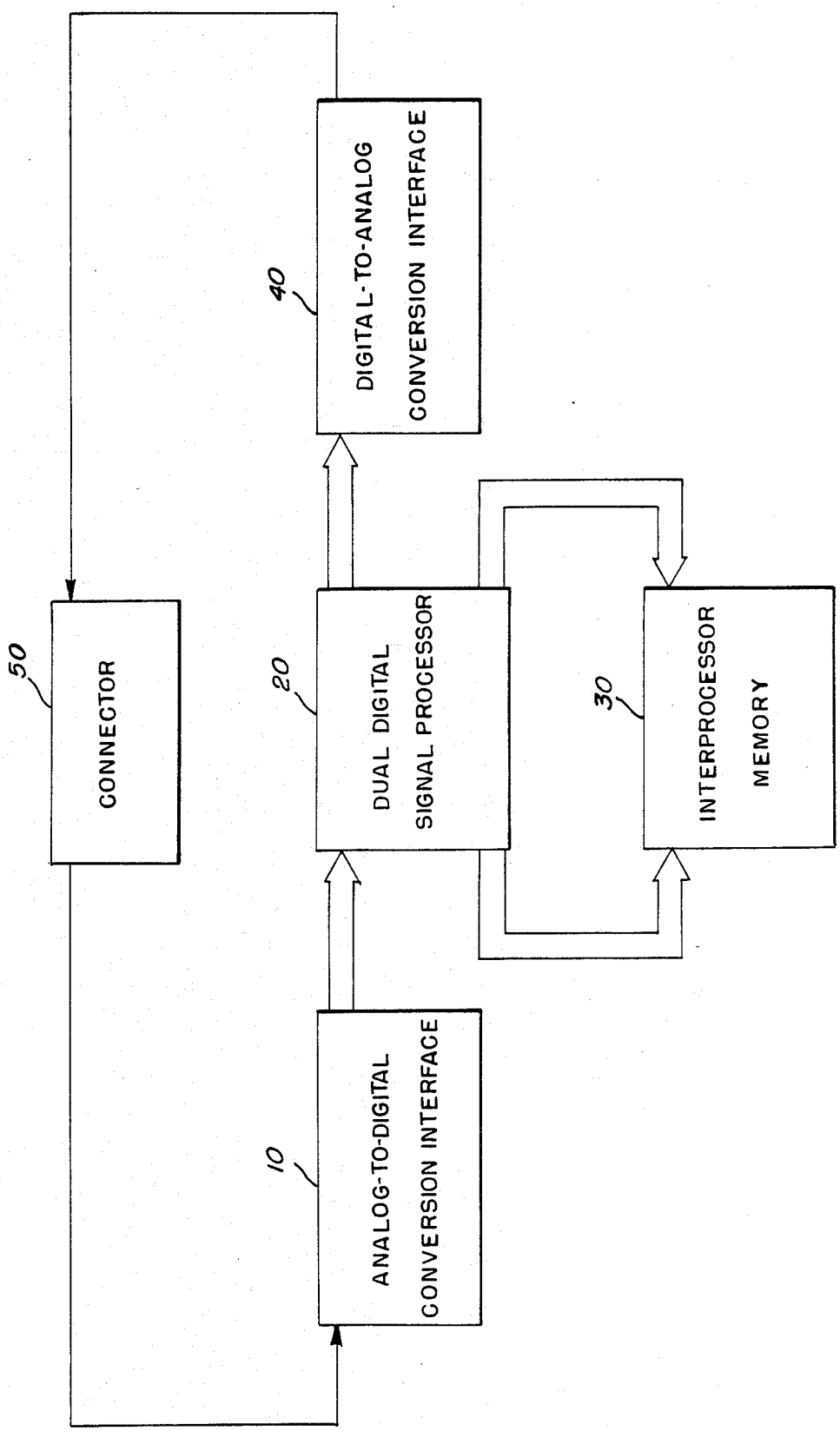
FIG. 1 is a block diagram of one embodiment of the digital Lincompex hardware of the present invention.

FIG. 1 illustrates a block diagram of the hardware of one preferred embodiment of the Lincompex communication system of the present invention. An analog to digital interface 10 is a 16-bit audio frequency analog-to-digital conversion chip including a typical 5 kHz anti-aliasing filter, a series-to-parallel converter, and a clock frequency divider/counter for sampling at 11K samples per second. A dual digital signal processor 20 is provided which, in one embodiment, includes two general purpose digital signal processor chips, each incorporating a 16 bit multiplier accumulator, local memory, and internal sequencing and logic control. Two signal processors are provided simply because the processing speed of one processor alone is too slow. An interprocessor dual port memory 30 is provided to permit the first signal processor to execute the first half of a program and then transfer its intermediate results to the second chip via the interprocessor memory. The second processor then executes the second half of the program. Digital-to-analog interface 40 is a 16 bit audio frequency digital-to-analog converter chip including a typical reconstruction filter and a parallel-to-serial data converter. Connector 50 denotes a physical connector consisting of plugs, sockets, and wires which carry data and control signals to and from the external environment. It is noted that the hardware described above is identical for performing both the compression and expansion functions of the system, these functions being implemented by the software programmed into the processor chips.

Figure 2:
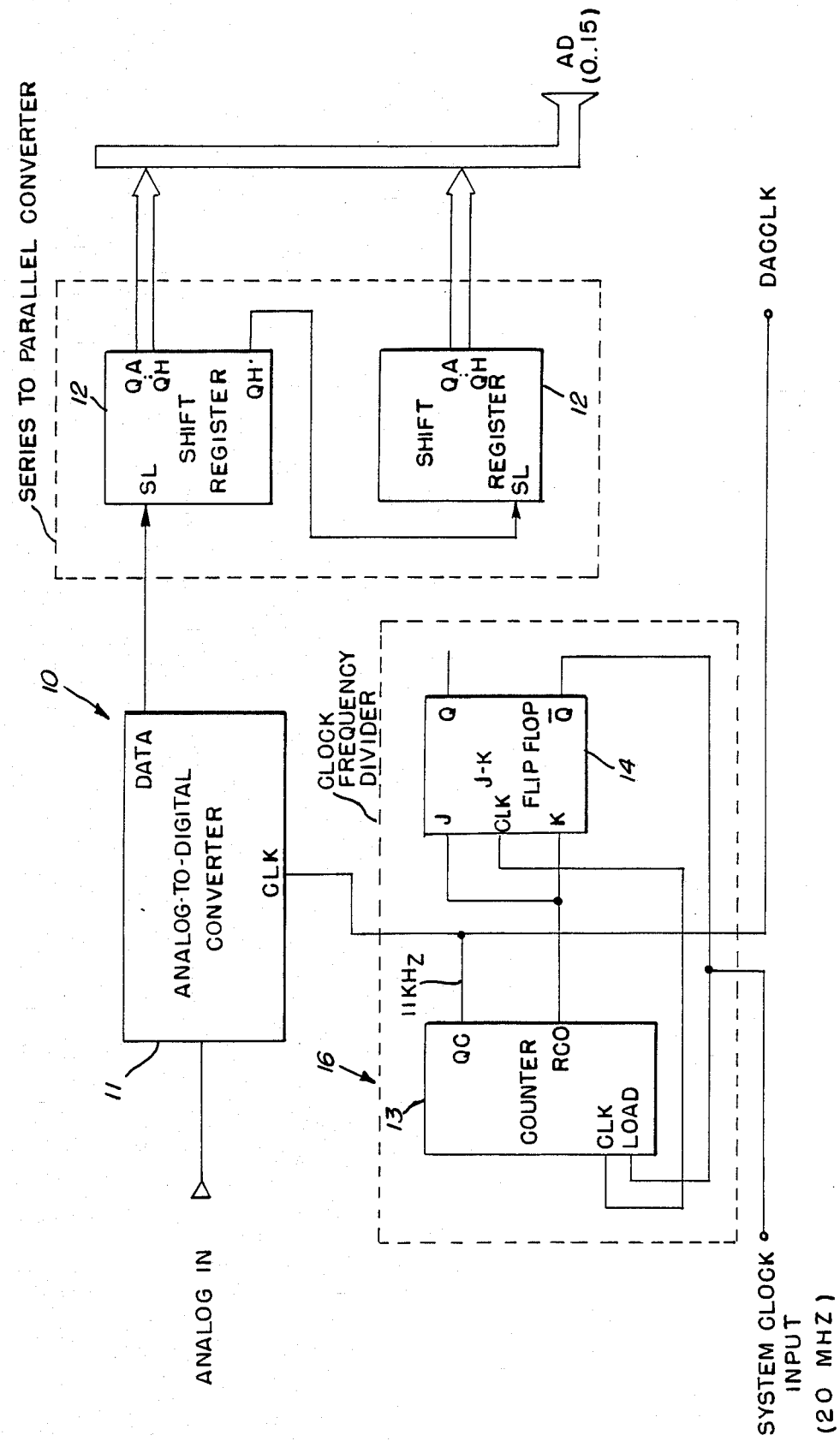
FIG. 2 is a schematic diagram of the analog-to-digital converter 10 of FIG. 1.

FIG. 2 illustrates in more detail the structure of the analog interface section of the system of FIG. 1. The interface 10 includes an analog-to-digital converter 11, two tapped shift registers 12 for converting the bit serial output of converter 11 to parallel format, a counter 13 and a flip-flop 14 for providing the converter 11 with a clock of 11 kHz for sampling at a rate of 11K samples per second. The internal clock 16 is provided with a 20 MHz master clock signal which is used to drive the signal processor chips.

Figure 3:
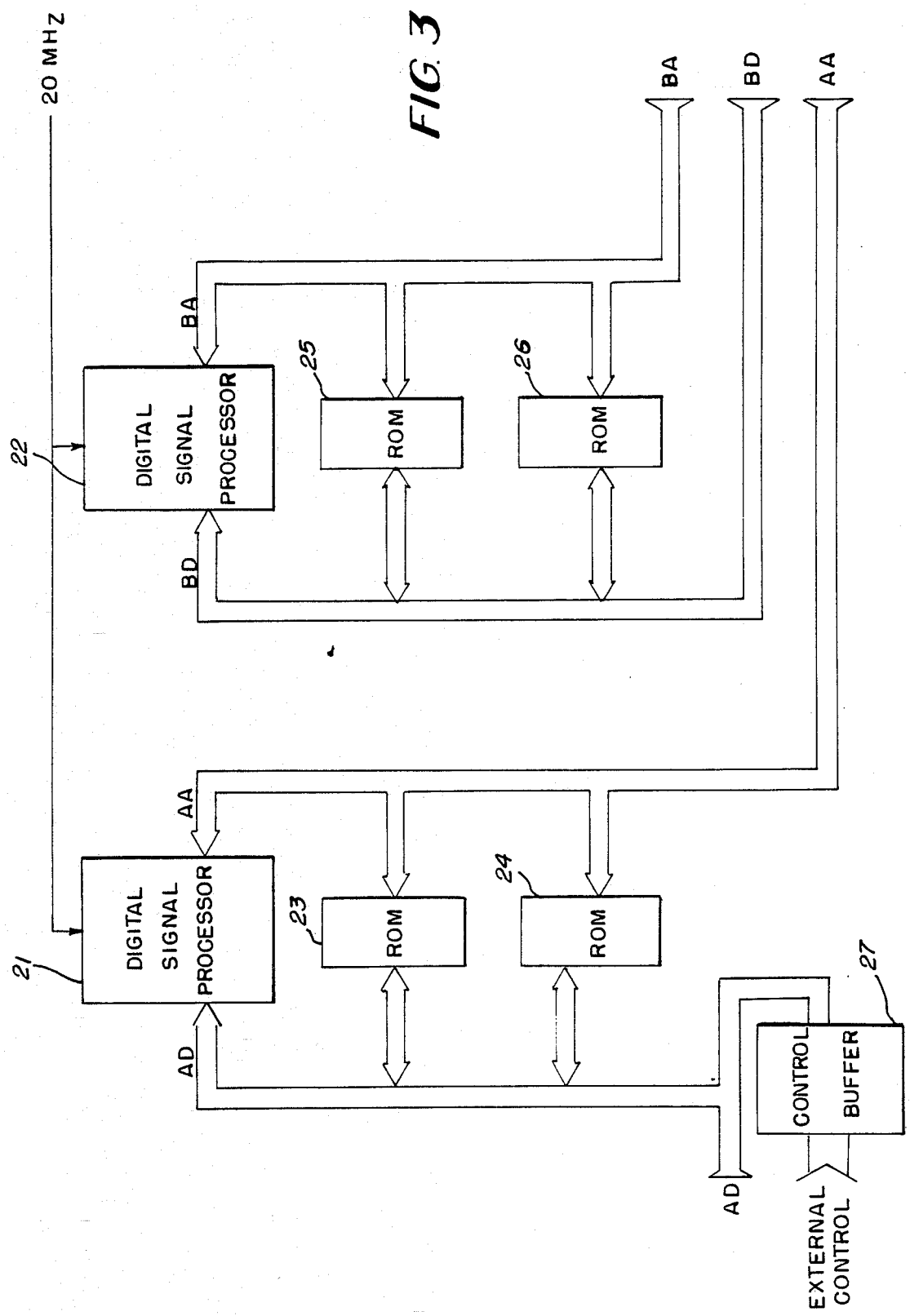
FIG. 3 is a schematic circuit diagram of the dual digital signal processor 20 of FIG. 1.

FIG. 3 is a schematic diagram of the dual digital signal processors of a preferred embodiment of the present invention in which the first processor 21 receives data on data bus AD from the A/D interface 10. Processor 21 executes the first half of the program stored in program ROMs 23 and 24, and passes the results to interprocessor memory 30 via data bus AD. The second processor 22 addresses the interprocessor memory to receive the intermediate results on data bus BD. The processor 22 executes the second half of the program stored in ROMs 25 and 26, and passes the final results to the digital-to-analog interface 40 via data bus BD. External control signals are input to processor 21 via control buffer 27 from inputs C10 to C17.

Figure 4:
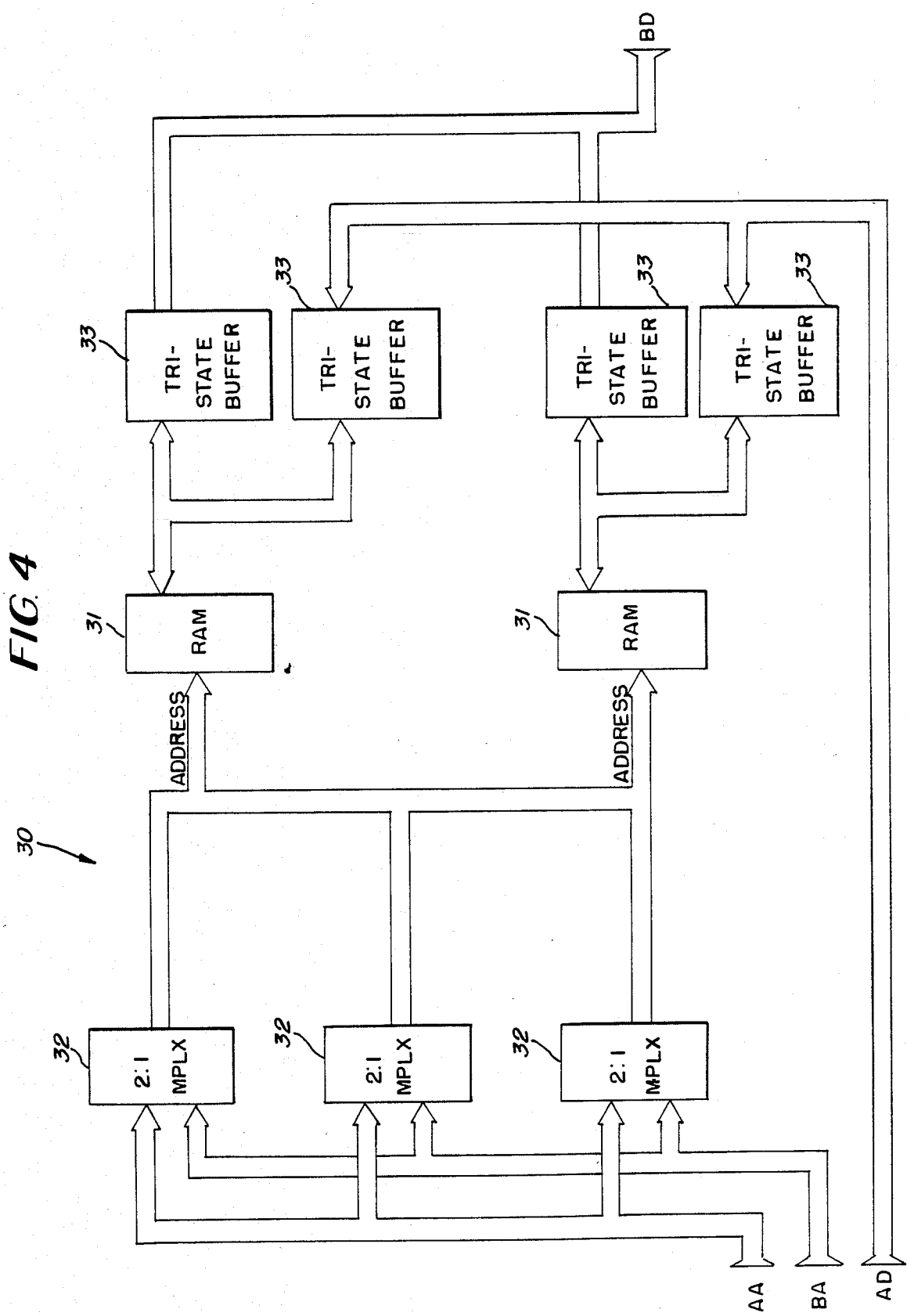
FIG. 4 is a schematic diagram of the interprocessor memory 30 of FIG. 1.

FIG. 4 illustrates the structure of the interprocessor memory 30. Since processor 21 writes data into single port RAMs 31 while processor 22 reads data from RAMs 31, 2:1 multiplexers 32 are provided to allow each processor to address RAMs 31 in turn via address busses AA and BA. Data busses AD and BD are connected to the memories 31 via tri-state buffers 33 to avoid bus contention by allowing only one bus to be connected to the RAMs 31 at one instant of time.

Figure 5:
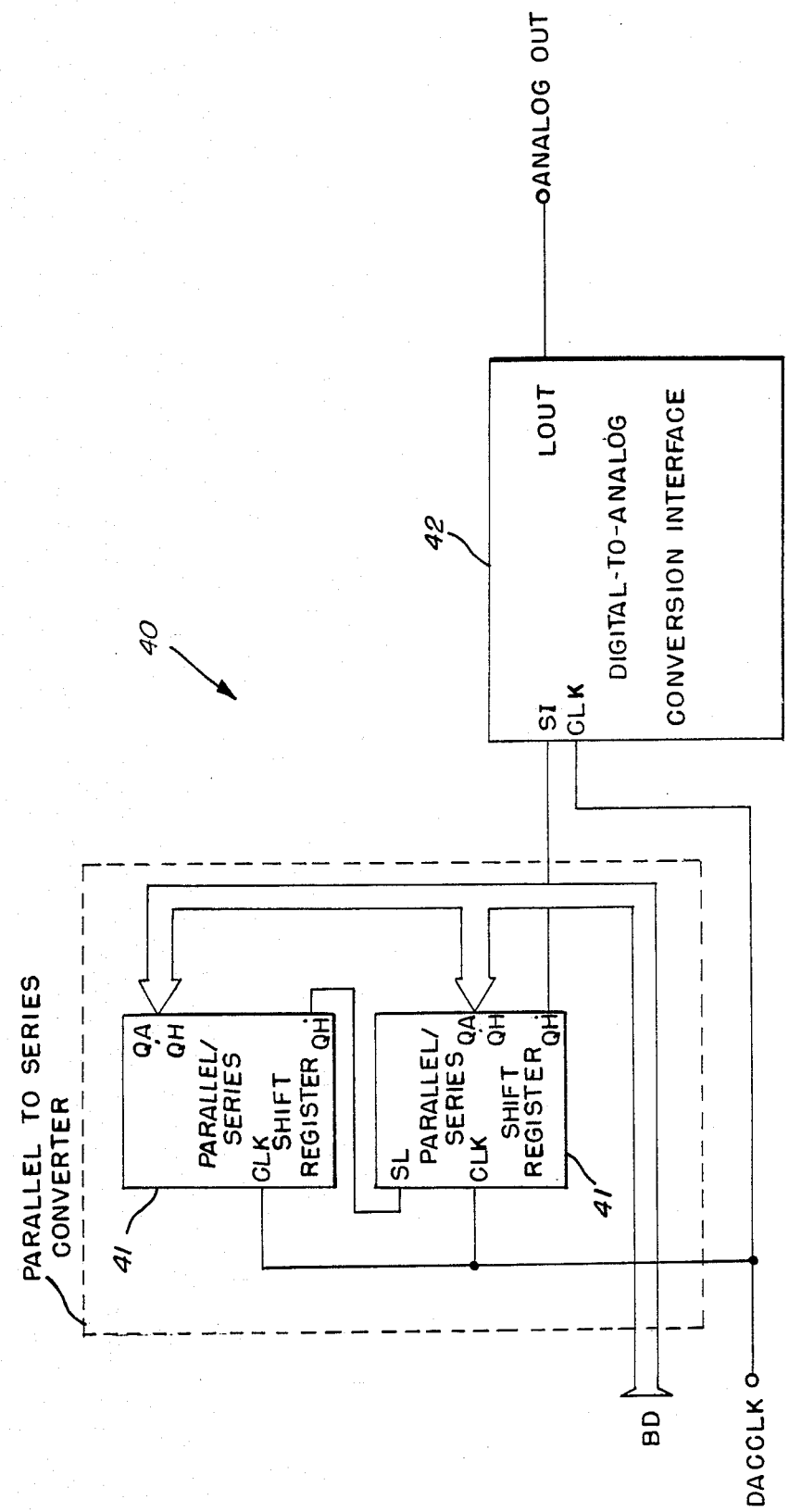
FIG. 5 is a schematic diagram of the digital-to-analog converter 40 of FIG. 1.

FIG. 5 illustrates the structure of the digital-to-analog interface 40. Data is input to converter 40 from second processor 22 via data bus BD into parallel-to-series shift registers 41. The D/A converter 40 is driven by the 11 kHz clock 16 via lines DACCLK. Audio frequency digital-to-analog converter 42 then converts the serial data to an audio frequency analog signal and outputs this signal at output 11.

DESCRIPTION OF OPERATION

Figure 6:
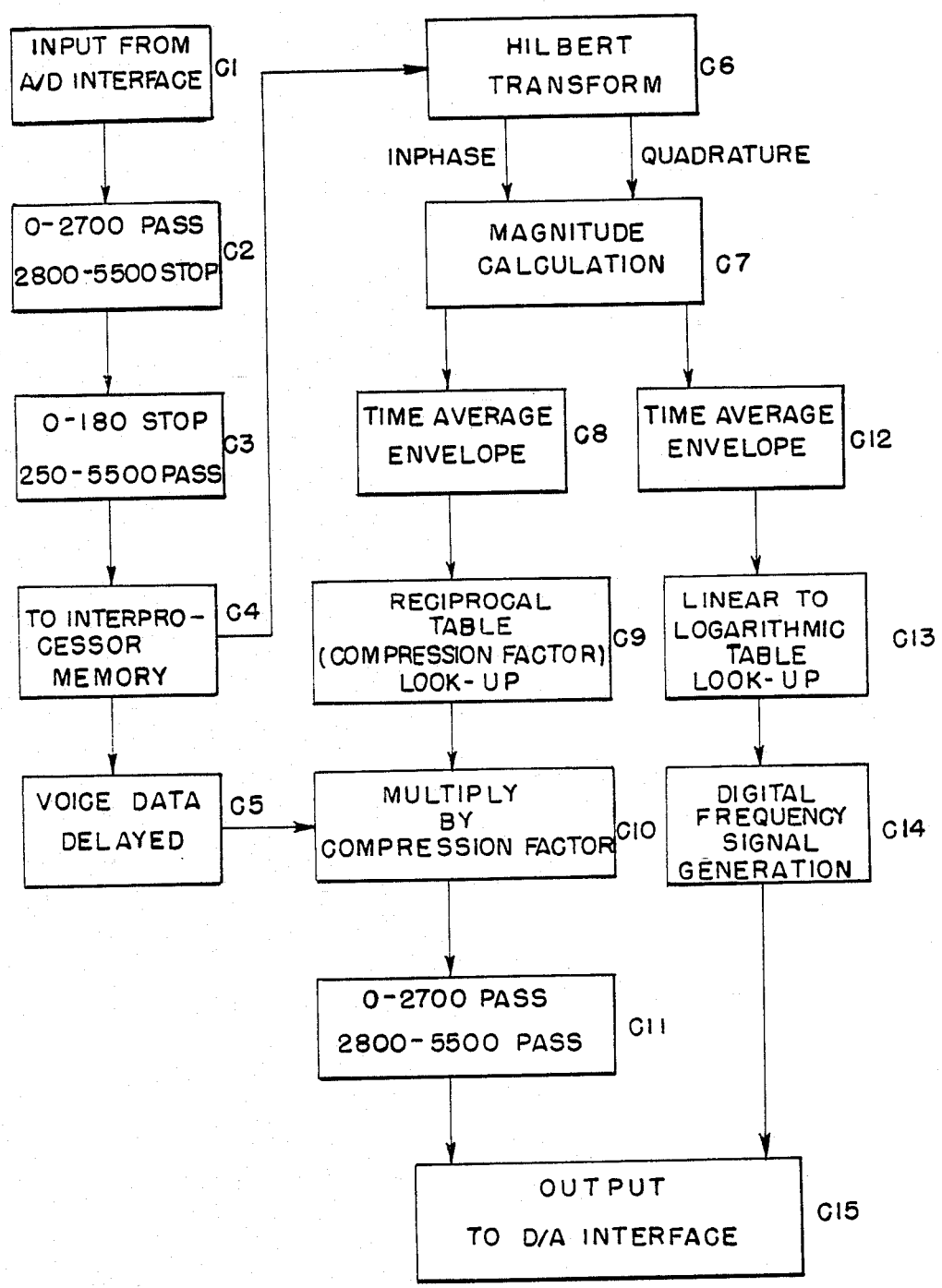
FIGS. 6 and 7 are flow charts explaining the operations of the dual digital signal processor 20 for signal compression and signal expansion respectively.

The operation of the Lincompex system of a preferred embodiment of the present application will now be described with reference to the flow charts of FIGS. 6 and 7. A speech signal to be transmitted is input at step C1 as a 16-bit parallel digital signal to processor 21 via data bus AD from A/D interface 10. At step C2, processor 21 filters the digital signal to pass components up to 2700 Hz and eliminating any signal components from 2800 to 5500 Hz, while at step C3, low frequency noise components up to 250 Hz are eliminated. The upper limit of these filtering steps C2 and C3 is determined by the Nyquist sampling rate of the 11 kHz in the A/D converter 11. At step C4, the intermediate results are passed to interprocessor memory 30 on data bus AD where they are stored and sent to processor 22 via data bus B. At step C6, the filtered digital voice data signal is Hilbert transformed, i.e. the voice frequency is shifted by 90° to produce inphase and quadrature components of a complex signal to enable the speech envelope to be measured at step C7. The magnitude calculation of step C7 computes the pythagorean magnitude of the voice data signal from its real and imaginary components, thereby eliminating the voice carrier frequency and leaving just the amplitude envelope of the voice data for further processing. Since the envelope must be sampled at an approximate syllabic rate, the envelope is time averaged at step C8. At step C9, the compression factor is determined from a reciprocal look-up table since the louder the input speech, the smaller the gain to be applied to the voice data signal in order to provide a compressed signal of substantially constant amplitude. At step C5, the same voice data signal as was applied to the Hilbert transform at step C6 is delayed to take account of the additional processing steps C7 to C9 undergone by this signal. The reciprocal factor is then used at step C10 to attenuate the input voice data signal. At step C11, frequency components above 2800 Hz are eliminated to avoid aliasing and to equalize the signal for the act of sampling. As in step C8, step C12 performs a time average calculation of the envelope to approximate the syllabic rate of the voice data signal. The envelope magnitude is then converted to a logarithmic value at step C13 to compensate for the "volts to decibels" requirements of the control tone frequency shift. The computed value is then applied at step C14 to generate a digital control tone signal whose frequency is proportional to the value computed in the logarithmic table look-up and thus logarithmically related to the compression factor. Finally, at step C15 the compressed digital signal from step C11 and the corresponding digital control tone signal computed in step C14 are applied to the D/A converter 40 via data bus BD to be converted to an analog signal and input to a transmitter device.

Figure 7:
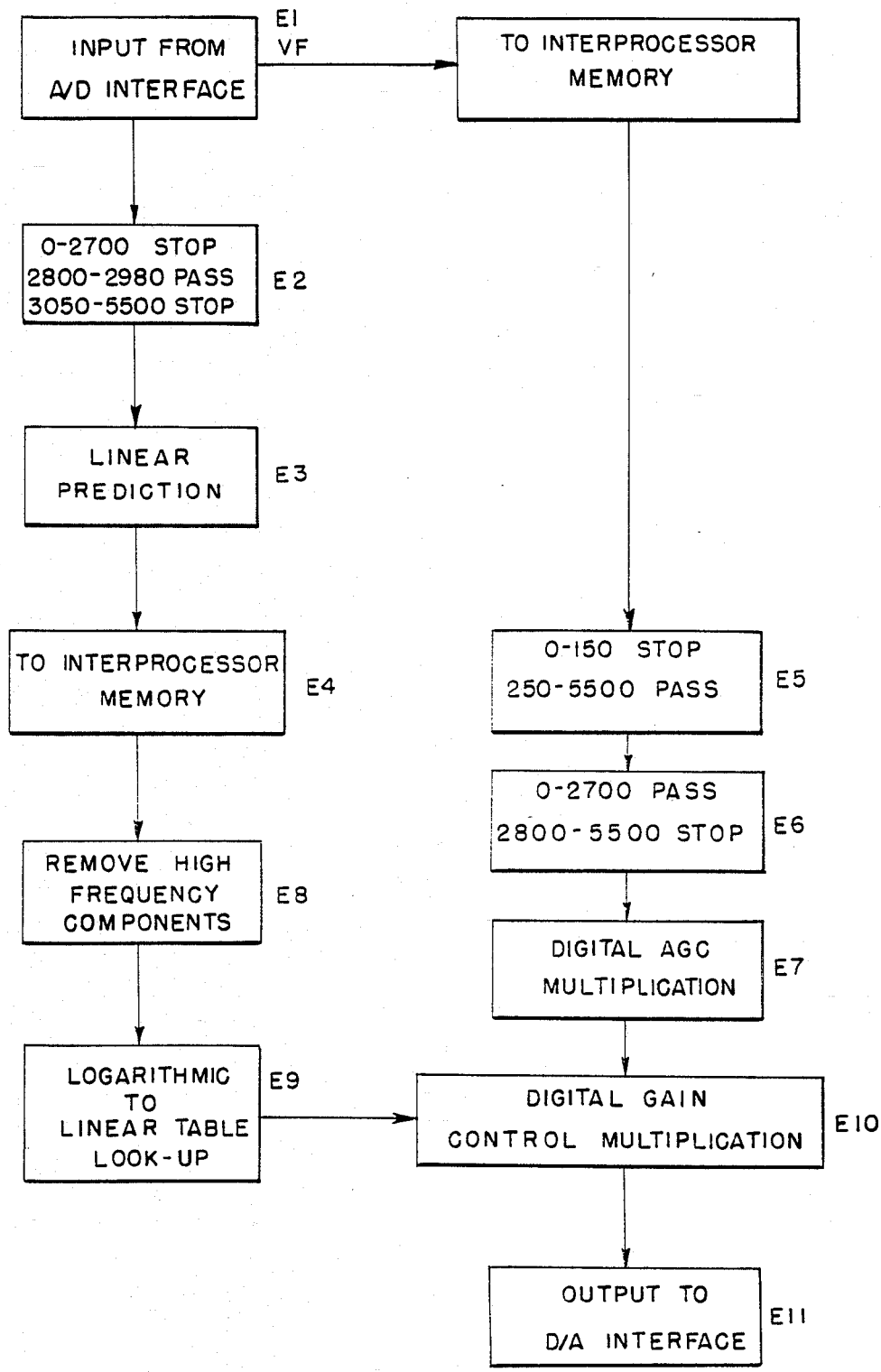

FIG. 7 is a flow chart illustrating the operations performed by the Lincompex receiver of a preferred embodiment of the present invention. A compressed analog signal received at a receiver of the device is input to A/D interface 11 with a resulting 16-bit parallel digital signal being input to processor 21 at step E1, via data bus AD. The main voice frequency signals are then passed directly to interprocessor memory 30. At step E2 the digital signal is filtered to allow only components in the 2800 to 2980 Hz frequency band to remain. This frequency band contains the digital control tone frequency. At step E3, the received digital control tone signal is mixed with a 2900 Hz sine wave, by digitally multiplying the digital control tone signal by the sine and cosine components of the 2900 Hz wave to produce complex components of the base band control tone. These components are then processed to compute their magnitude and phase whereby a phase increment signal is computed which is directly proportional to the frequency of the base banded control tone.

Figure 8:
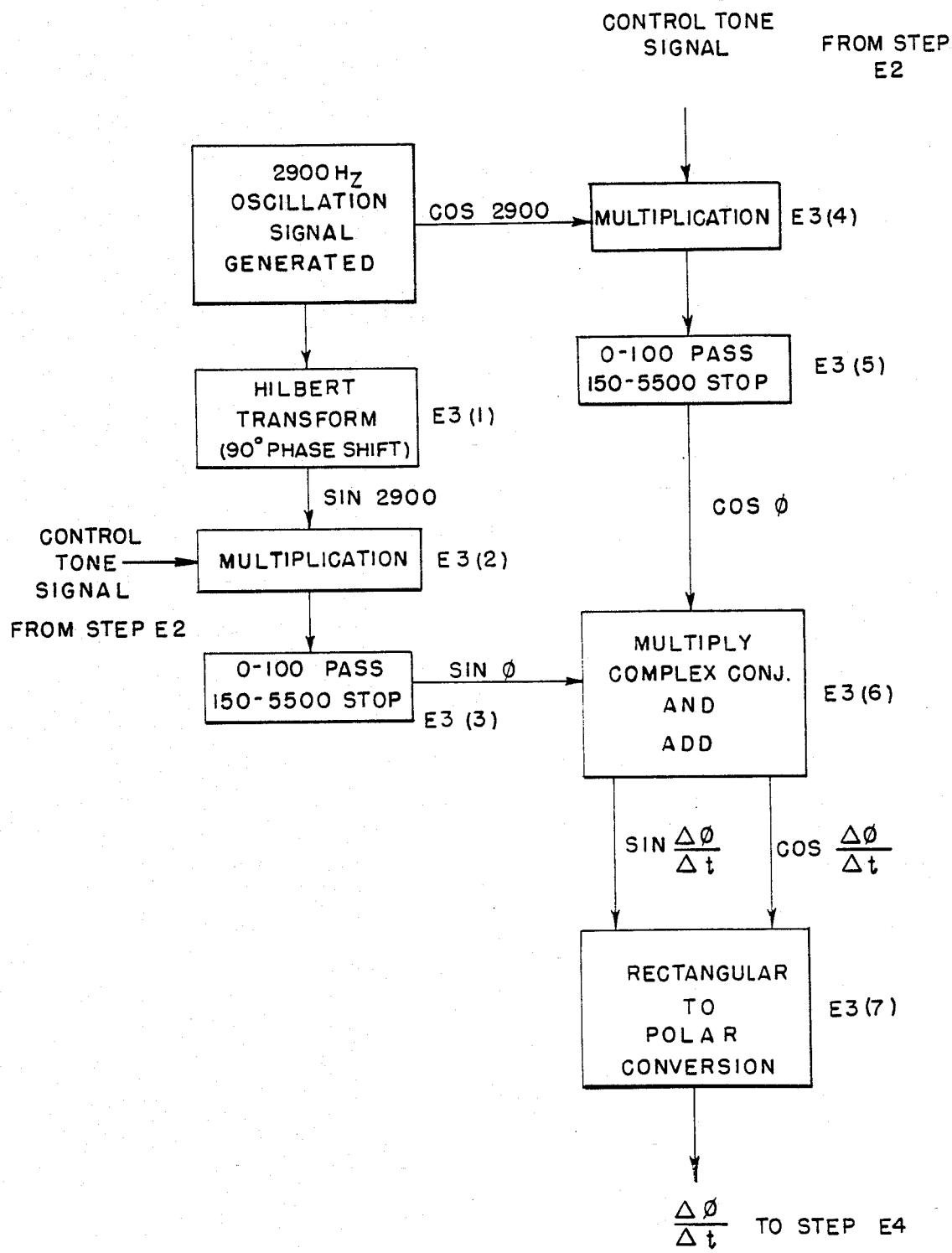
FIG. 8 is a flow chart explaining the linear prediction step E3 of FIG. 7.

FIG. 8 is a flow chart of the detailed operations of the linear prediction step E3. The generated 2900 Hz signal is Hilbert transformed at step E3(1) to generate a sine component of the signal which is then multiplied at step E3(2) with the control tone signal which at this point is modulated on a 2900 Hz carrier signal. The inphase and quadrature components are then low-pass filtered at step E3(3), leaving only the quadrature baseband control tone displacement signal in the control tone band. Similar operations are performed with the cosine component of the 2900 Hz signal at steps E3(4) and E3(5). At step E3(6), a simple linear predictive code multiplies each complex sample by the complex conjugate of the next sample, as illustrated by the equation $$(Re1+jIm1) \times (Re2-jIm2) = (Re1 \times Re2 + Im1 \times Im2) + j(Re2 \times Im1 - Re1 \times Im2)$$

The multiplication is carried out for four consecutive sample pairs in which the angle of each of the product vectors is directly proportional to the control tone displacement frequency, since this angle represents the amount of displacement from sample to sample. At step E3(7), the rectangular coordinate product vector is transformed to polar notation, thereby directly obtaining its angle as a phase increment signal.

At step E4 the phase increment signal is sent to the interprocessor memory via data bus AD. At steps E5 and E6, the voice data signals are filtered to remove components below 150 Hz or above 2700 Hz. At step E7, the filtered signal is multiplied by a digital automatic gain control factor which is determined by the filtered magnitude of the signal itself. This automatic volume control is needed to keep the magnitude of the compressed signal within the 16-bit fixed point range of expander circuits.

At step E8, the phase increment signal is processed to remove high frequency components to allow the expansion of the compressed signal to occur on a syllabic basis. At step E9, the logarithmic phase increment signal is converted to a linear gain factor, inversely related to the compression factor, by consulting a logarithmic to linear look-up table. This digital gain factor or expansion factor is applied to the compressed and equalized voice data signal at step E10 to reproduce the original speech amplitude levels.

The expanded digital voice data signal is then applied to the D/A interface 40 via data bus BD, where it is converted to an audio frequency voice signal to be output on an output device.

The invention being thus described, it will be obvious that the same may be varied in many ways. Such variations are not to be regarded as a departure from the spirit and scope of the invention, but all such modifications as would be obvious to one skilled in the art are intended to be included within the scope of the following claims.

What is claimed is:

1. A linked compressor-expander telecommunications system comprising:
   a compressor, including,
   analog-to-digital converter means for converting an analog audio signal into a parallel data digital signal;
   digital signal processor means for compressing said digital signal, said processor means performing the steps of,
      filtering said digital signal to remove components above a predetermined frequency,
      shifting the phase of said filtered digital signal by 90°,
      supplementing the filtered digital signal with the phase-shifted digital signal to produce a complex signal, computing the magnitude of the audio signal from said complex signal,
      time-averaging said magnitude to approximate a syllabic rate of said audio signal,
      generating a digital control tone having a frequency representative of said time-averaged magnitude,
      multiplying said digital signal by an amount inversely related to said time-averaged magnitude to produce a compressed digital signal having a compression factor,
      filtering said multiplied digital signal to remove components above said predetermined frequency, and outputting said compressed digital signal and said digital control tone; and
   digital-to-analog converter means for converting said compressed digital signal and said digital control tone to a combined analog signal for transmission on a transmission medium; and
   an expander, including,
   analog-to-digital converter means for converting a compressed analog signal containing data and modulated expander control components to a parallel data digital signal;
   digital signal processor means for expanding said compressed data components of said digital signal, said processor means performing the steps of, separating said compressed data components and said expander control components of said digital signal, multiplying said modulated expander control component by components of a predetermined frequency to obtain a demodulated control component, said step of multiplying including, multiplying consecutive samples of said expander control component by components of said predetermined frequency to obtain a plurality of complex signals, multiplying said complex signals by the complex conjugate of a consecutive complex signal to obtain a product, and converting said product into polar coordinate notation and obtaining an angle of said polar coordinate product as said demodulated control component, computing a value representing the compression factor of a data component based upon said demodulated control component, computing an expansion factor based upon said computed compression factor, multiplying said data component by said expansion factor to produce an expanded data signal, and outputting said expanded data signal; and digital-to-analog converter means for converting said expanded data signal to an audio frequency analog signal.

2. The compressor recited in claim 1 wherein said parallel data digital signal comprises a 16-bit parallel data signal.

3. The compressor recited in claim 1 wherein said analog-to-digital converter means of said compressor includes means for sampling said audio signal at an appropriate rate.

4. The compressor recited in claim 1 wherein said digital signal processor means includes a plurality of digital signal processor units and interprocessor memory means for allowing data to pass between respective processor units.

5. The compressor recited in claim 1 wherein said audio signal is a voice signal.

6. An expander for a linked compressor-expander telecommunications system, comprising:

analog-to-digital converter means for converting a compressed analog signal containing data and modulated expander control components to a parallel data digital signal;

digital signal processor means for expanding said compressed data components of said digital signal, said processor means performing the steps of, separating said compressed data components and said expander control components of said digital signal, multiplying said modulated expander control component by components of a predetermined frequency to obtain a demodulated control component, said step of multiplying including multiplying consecutive samples of said expander control component by components of said predetermined frequency to obtain a plurality of complex signals, multiplying said complex signals by the complex conjugate of a consecutive complex signal to obtain a product, and converting said product into polar coordinate notation and obtaining an angle of said polar coordinate product as said demodulated control component, computing a value representing the compression factor of a data component based upon said demodulated control component, computing an expansion factor based upon said computed compression factor, multiplying said data component by said expansion factor to produce an expanded data signal, and outputting said expanded data signal; and digital-to-analog converter means for converting said expanded data signal to an audio frequency analog signal.

7. The expander recited in claim 6, wherein said compressed data components represent syllables of speech.

8. The expander recited in claim 6, wherein said parallel data digital signal comprises a 16-bit parallel data signal.

9. The expander recited in claim 6, wherein said analog-to-digital converter means includes means for sampling said compressed analog signal at an appropriate rate.

10. The expander recited in claim 6, wherein said digital signal processor means includes a plurality of digital signal processor units and interprocessor memory means for allowing data to pass between respective processor units.

* * * * *